United States Patent [19]
Vallancourt

[11] Patent Number: 6,094,098
[45] Date of Patent: *Jul. 25, 2000

[54] TECHNIQUE FOR DESIGNING AN AMPLIFIER CIRCUIT IN AN INTEGRATED CIRCUIT DEVICE

[75] Inventor: David Gerard Vallancourt, Red Bank, N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 09/098,971

[22] Filed: Jun. 17, 1998

[51] Int. Cl.$^7$ ........................................................ H03F 3/45
[52] U.S. Cl. ................................. 330/253; 330/257
[58] Field of Search .................... 330/257, 258, 330/253, 252

[56] References Cited

U.S. PATENT DOCUMENTS

| | | | |
|---|---|---|---|
| 4,429,283 | 1/1984 | Wittlinger | 330/257 |
| 4,607,232 | 8/1986 | Gill, Jr. | 330/255 |
| 5,818,295 | 10/1998 | Chimura et al. | 327/561 |

*Primary Examiner*—Robert Pascal
*Assistant Examiner*—Henry Choe
*Attorney, Agent, or Firm*—Alex L. Yip

[57] ABSTRACT

In an operational amplifier (op amp) for use in an integrated circuit (IC) device, a first field effect transistor (FET) in a current-mirror circuit is connected, and provides a bias current, to at least a second FET in a differential amplifier. As the voltage of the power supply to the op amp decreases in response to the advance of IC technology, the first FET operates in a non-saturation region of its output characteristics. As a result, the current provided by the first FET to the differential amplifier varies substantially with a common-mode signal, whose signal level equals the average of those of non-inverting and inverting input signals to the differential amplifier. Consequently, the op amp imparts a significant gain, referred to as a common-mode gain, to the common-mode signal, which is undesirable. To reduce such a common-mode gain, in accordance with the invention, the bias current provided by the first FET is measured to adjust a second current which affects the output of the op amp.

28 Claims, 2 Drawing Sheets

TECHNIQUE FOR DESIGNING AN AMPLIFIER CIRCUIT IN AN INTEGRATED CIRCUIT DEVICE

FIELD OF THE INVENTION

The invention relates to an integrated circuit (IC) design, and more particularly to a technique for incorporating an amplifier circuit, e.g., an operational amplifier (op amp), in an IC device.

BACKGROUND OF THE INVENTION

Nowadays, use of integrated circuit (IC) devices is ubiquitous. It is common that an IC device provides both analog and digital functions in a single package. For example, an IC device for a digital signal processing application typically includes analog amplifiers, e.g., one or more operational amplifiers (op amps), and digital circuits for processing an input signal.

A typical op amp is realized in an IC device using field effect transistors (FETs), e.g., metal-oxide semiconductor FETs (MOSFETs). Such an op amp comprises a current-mirror circuit, and a differential amplifier which receives inverting and non-inverting input signals to the op amp, respectively. In the typical op amp, a first FET in the current-mirror circuit is connected to at least a second FET in the differential amplifier to provide a desired bias current to the second FET. The first FET operates in a saturation mode, and the drain current thereof is constant and repetitive of a reference current provided in the current-mirror circuit.

Ideally, an op amp imparts a large gain, referred to as a "differential gain," to only the difference between the signal levels of the inverting and non-inverting input signals. However, in practice, the op amp also imparts another gain, referred to as a "common-mode gain," to a common-mode signal whose signal level equals the average of those of the inverting and non-inverting input signals. A common-mode rejection ratio (CMRR) which is defined as a ratio of the differential gain to the common-mode gain is often used as a figure of merit for the op amp. Since the output of an ideal op amp varies only with the aforementioned difference and is totally independent of the common-mode signal level, the CMRR of the ideal op amp is infinitely large, with the common-mode gain being zero.

As IC technology advances, the size limit, known as the "minimum feature size," of the circuit element s including FETs in an IC device decreases. Accordingly, the size of the circuit elements in the IC device is reduced to save space. As a result, the voltage of the power supply to the device needs to be reduced, stemming from the fact that the electric fields within the FETs in an IC device increase inversely with the size thereof. A lower power supply voltage reduces such electric fields which would otherwise cause an undesirable or even destructive current discharge within the FETs. Moreover, a lower power supply voltage causes lower power consumption in the IC device, which is desirable especially when the device is employed in a battery powered apparatus, e.g., a wireless telephone handset. Since the battery in such an apparatus has a limited capacity, the lifetime of the battery before replacement or recharging thereof increases as the power consumption of the IC device decreases. Thus, as the IC technology progresses to "0.1 $\mu$m" technology in the near future, it is anticipated that the power supply voltage is going to be reduced from about 3 volts presently to about 1 volt.

SUMMARY OF THE INVENTION

I have recognized that when the power supply voltage to the op amp described above is reduced, e.g., to about 1 volt, the drain-to-source voltage $V_{ds}$ Of the first FET in the above current-mirror circuit is necessarily reduced, in response to the common-mode signal communicated through the second FET in the above differential amplifier, to the extent that the $V_{ds}$ causes the first FET to operate in a non-saturation mode, as opposed to the saturation mode as in prior art. As a result, the drain current $I_d$ from the first FET is no longer constant and repetitive of the reference current in the current-mirror circuit. Rather, the drain current in question varies substantially with the common-mode signal level. However, a second current in the current-mirror circuit, which provides a bias current to an output stage of the op amp, remains constant and continues to mirror the reference current. Consequently, the output of the op amp varies substantially with the common mode signal level, resulting in an undesirably low CMRR.

To maintain a high CMRR for the op amp despite the reduction of the power supply voltage, in accordance with the invention, the second current which affects the output varies with the drain current $I_d$. To that end, a measure indicative of an amount of such a drain current is obtained, and the second current is then generated based on that measure.

BRIEF DESCRIPTION OF THE DRAWING

In the drawing.

Throughout this disclosure, unless otherwise stated, like elements, components or sections in the figures are denoted by the same numeral.

DETAILED DESCRIPTION

Figure 1:
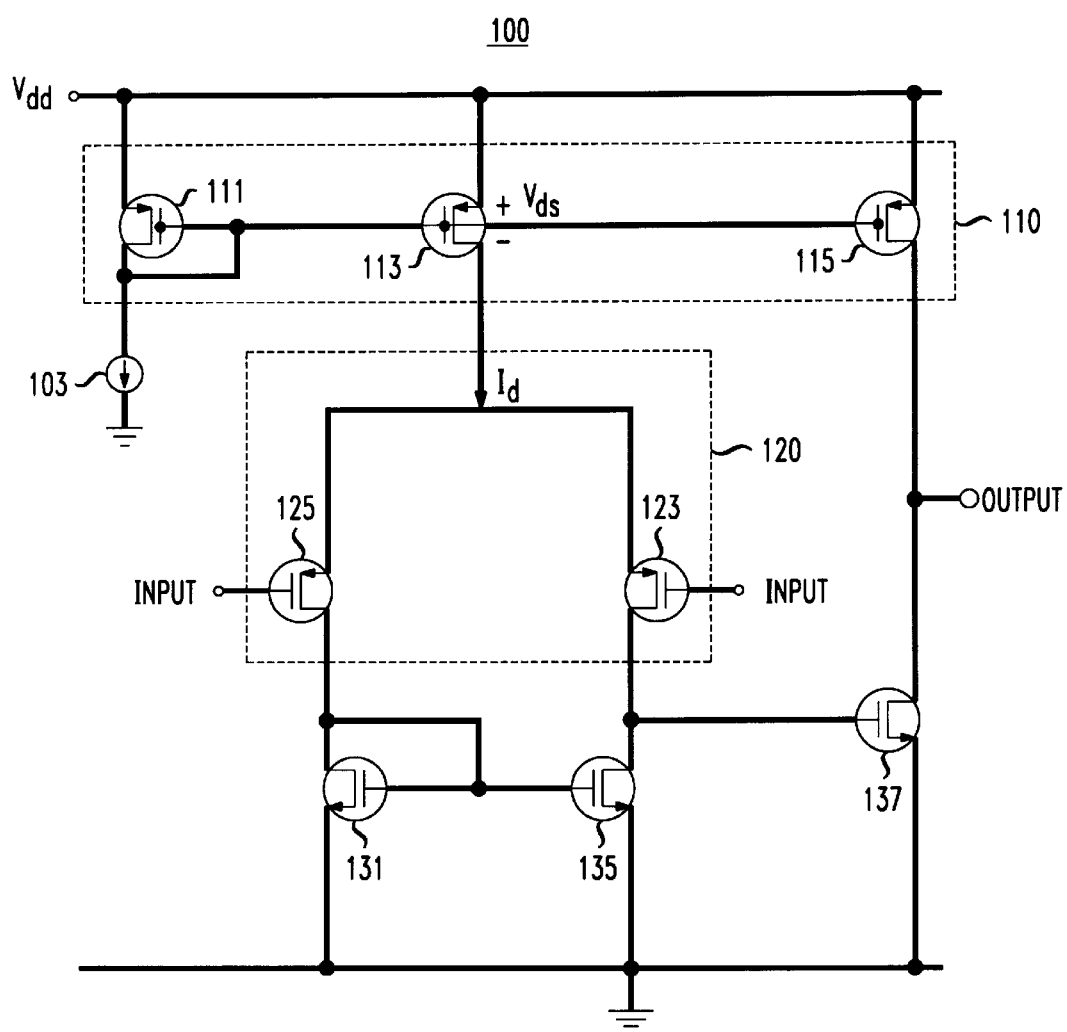
FIG. 1 illustrates a prior art op amp circuit for use in an IC device.

FIG. 1 illustrates prior art ope rational amplifier (op amp) circuit 100 embodied in an integrated circuit (IC) device. The IC device may be a conventional digital signal processor (DSP).

In circuit 100, the voltage of a power supply to the IC device is denoted $V_{dd}$. Circuit 100 includes current-mirror circuit 110 which comprises p-channel field effect transistors (pFETs) 111, 113 and 115. The latter are connected to one another by their respective gate terminals. In a conventional manner, current source 103 is used to properly bias pFET 111 to establish a stable operating point thereof. Assuming that the geometric dimensions of pFETs 111, 113 and 115 in current-mirror circuit 110 are identical, and each pFET operates in a saturation region of its output characteristics, which is typical in prior art, the amount of the drain current provided by each pFET is constant and substantially the same.

In particular, the drain current $I_d$ from pFET 113, which is constant, is provided as a bias current to pFET 123 and pFET 125 in differential amplifier 120 to afford a high common-mode rejection ratio (CMRR) to op amp circuit 100. The CMRR is defined as a ratio of a differential gain of circuit 100 to a common-mode gain thereof. Op amp circuit 100 in this instance imparts a large gain, referred to as the differential gain, to the difference between the level of an inverting input signal at the gate terminal of pFET 123 and that of a non-inverting input signal at the gate terminal of pFET 125. However, op amp circuit 100 also imparts a relatively small gain, referred to as the common-mode gain, to a common-mode signal whose signal level equals the average of those of the inverting and non-inverting input signals. It should be noted that the CMRR of an ideal op amp, whose output varies with the aforementioned difference only, is infinitely large, with the common-mode gain being zero. That is, the output of an ideal op amp is totally independent of the common-mode signal.

In a well known manner, n-channel FETs (nFETs) 131 and 135 constitute an active load to differential amplifier 120. The output of differential amplifier 120 is taken from a common drain connection between pFET 123 and nFET 135, and drives an amplification stage comprising nFET 137 and pFET 115. The latter provides a constant bias current to the amplification stage for the output of op amp circuit 100, which is taken from a common drain connection between pFET 115 and nFET 137.

As IC technology advances, the size limit, known as the "minimum feature size," of the circuit elements including FETs in an IC device decreases. Accordingly, the size of the circuit elements in the IC device is reduced to save space. As a result, the voltage of the power supply to the device, e.g., $V_{dd}$ above, needs to be reduced, stemming from the fact that the electric fields within the FETs in an IC device increase inversely with the size thereof. A lower power supply voltage reduces such electric fields which would otherwise cause an undesirable or even destructive current discharge within the FETs. Moreover, a lower power supply voltage causes lower power consumption in the IC device, which is desirable especially when the device is employed in a battery powered apparatus, e.g., a wireless telephone handset. Since the battery in such an apparatus has a limited capacity, the lifetime of the battery before replacement or recharging thereof increases as the power consumption of the IC device decreases. Thus, as the IC technology progresses to "0.1 $\mu$m" technology in the near future, it is anticipated that the power supply voltage is going to be reduced from about 3 volts presently to about 1 volt.

However, in response to the advance of IC technology, as the power supply voltage $V_{dd}$ in circuit 100 is reduced, e.g., to about 1 volt, the drain-to-source voltage $V_{ds}$ of pFET 113, which is constrained by $V_{dd}$ and responsive to the common-mode signal communicated through pFET 123 and pFET 125, is accordingly reduced. The reduced $V_{ds}$ necessarily causes pFET 113 to operate in a non-saturation mode, as opposed to the saturation mode as in prior art. As a result, the drain current of pFET 113, i.e., $I_d$, which serves as the bias current to pFET 123 and pFET 125 is no longer constant and no longer mirrors that of pFET 111. Rather, $I_d$ varies substantially with the common-mode signal level. However, the drain current of pFET 115, which serves as the bias current to the aforementioned amplification stage for the output of circuit 100, remains constant and continues to mirror that of pFET 111. Consequently, the output of op amp circuit 100 varies substantially with the common mode signal level, resulting in an undesirably low CMRR.

Figure 2:
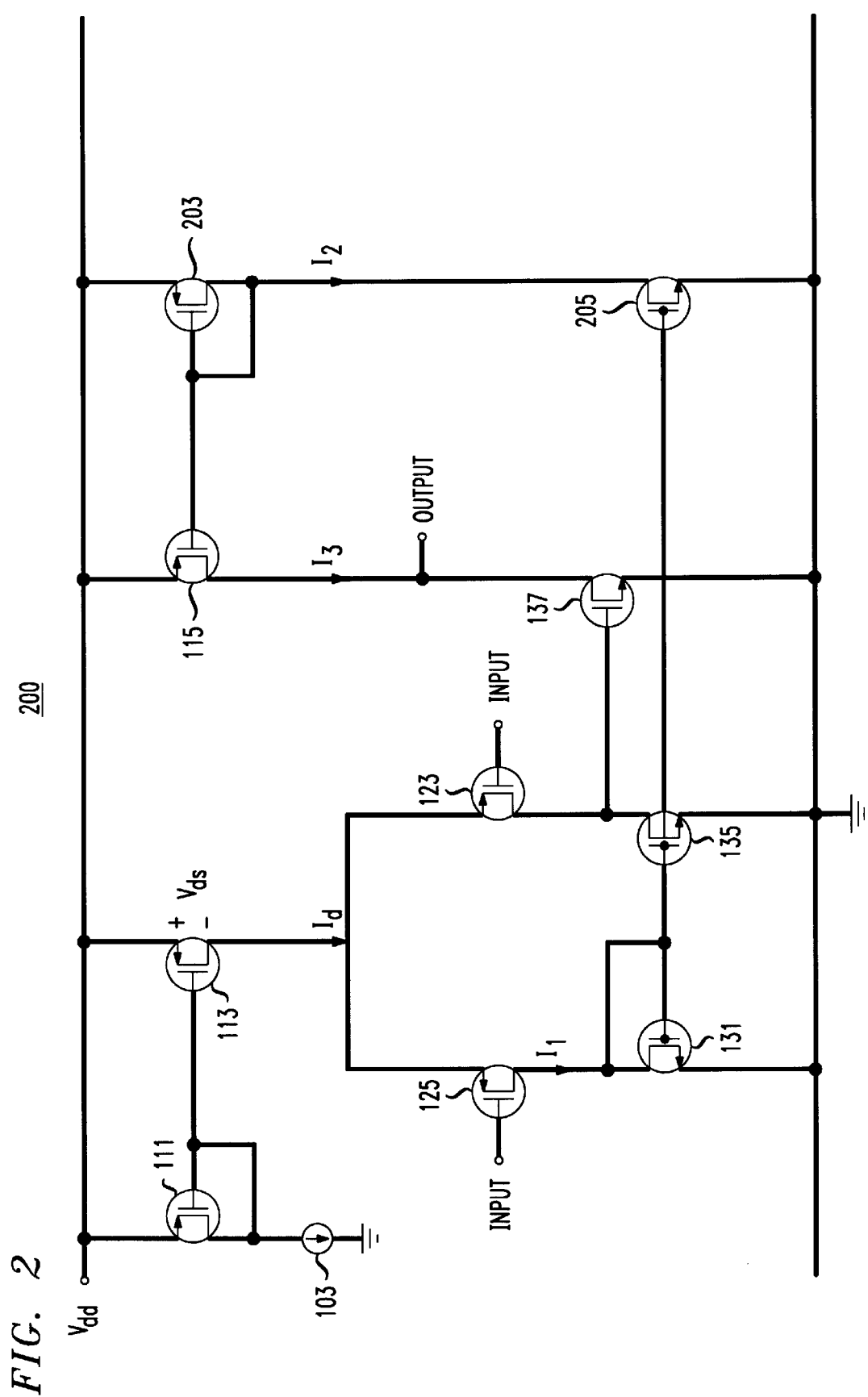
FIG. 2 illustrates an op amp circuit in accordance with the invention for use in an IC device.

I have recognized that in order to maintain a high CMRR for op amp circuit 100, the drain current of pFET 115 which affects the output of op amp circuit 100 needs to be adjusted according to the varying $I_d$. Thus, in accordance with the invention, a measure of the varying $I_d$ is communicated to pFET 115 to adjust its drain current accordingly. FIG. 2 illustrates op amp circuit 200 in accordance with the invention which, like circuit 100, is embodied in an IC device. Op amp circuit 200 is superior to circuit 100 in terms of its CMRR especially when pFET 113 operates in a non-saturation mode because of a low $V_{dd}$. Unlike circuit 100, circuit 200 further includes pFET 203 and nFET 205 which are connected to each other by their respective drain terminals. In addition, the gate terminal of pFET 115 is connected to the gate terminal of pFET 203, instead of the gate terminals of pFET 111 and pFET 113 as in circuit 100, to form a first current-mirror arrangement. That is, the drain current of pFET 115 no longer mirrors that of pFET 111 as in circuit 100, but mirrors that of pFET 203 here. Further, the gate terminal of nFET 205 is connected to the gate terminals of nFET 131 and nFET 135, forming a second current-mirror arrangement in which the drain current of nFET 205 mirrors that of nFET 131.

In operation, due to symmetry of pFET 123 and pFET 125, the drain current of nFET 131, denoted $I_1$, equals ½ $I_d$. In this instance, the geometric dimensions of nFET 205 are identical to those of nFET 131. Because of the aforementioned second current-mirror arrangement, the drain current of nFET 205 is a mirror image of that of nFET 131, i.e., $I_2=I_1=½ I_d$.

It should be noted at this point that the drain current of pFET 203 also equals $I_2=½ I_d$. It should also be noted that in this instance, the relative geometric dimensions of pFET 115 to those of pFET 203 are the same as the relative geometric dimensions of nFET 137 to those of nFET 131. With such a design, the bias current $I_3$ provided by pFET 115 and received by nFET 137 is properly prescribed to eliminate systematic offset. Further, because of use of the aforementioned first current-mirror arrangement in addition to the second current-mirror arrangement, $I_3$ mirrors $I_2$ and thus varies with $I_d$ with zero offset, thereby effectively suppressing the undesirable common-mode gain in circuit 200. As a result, circuit 200 advantageously affords a high CMRR.

The foregoing merely illustrates the principles of the invention. It will thus be appreciated that a person skilled in the art will be able to devise numerous arrangements which, although not explicitly shown or described herein, embody the principles of the invention and are thus within its spirit and scope.

For example, op amp circuit 200 is disclosed herein in a form in which various functions are performed by discrete circuit elements, e.g., FETs. However, any one or more of these functions could equally well be embodied in an arrangement in which the functions of any one or more of those elements, and indeed all of the functions thereof, are realized, for example, by circuit elements other than the FETs, e.g., bipolar junction transistors, and/or by one or more sub-circuits equivalent thereto.

I claim:

1. An amplifier circuit comprising:

a first transistor element;

a second transistor element and a third transistor element which are connected to the first transistor element, the second transistor element and the third transistor element having input terminals receiving inputs to the amplifier circuit, respectively, an amount of a current from the first transistor element varying with the inputs;

a first sub-circuit for obtaining a measure indicative of the amount of the current from the first transistor element, the first sub-circuit including a fourth transistor element and a fifth transistor element connected to each other, the fourth transistor element being connected to a terminal of the second transistor element other than the input terminal thereof, the fifth transistor element being connected to a terminal of the third transistor element other than the input terminal thereof; and a second sub-circuit responsive to the measure for providing a second current on a link connected to an output of the amplifier circuit to affect the output.

2. The circuit of claim 1 wherein at least one of the transistor elements is a field effect transistor (FET).

3. The circuit of claim 1 wherein the first sub-circuit includes a current-mirror circuit.

4. The circuit of claim 1 wherein the second sub-circuit includes a current-mirror circuit.

5. The circuit of claim 1 wherein the second and third transistors form at least part of a differential amplifier.

6. An amplifier circuit including a differential amplifier which receives first and second signals input to the circuit, the circuit comprising:
 a circuit element, which is connected to the differential amplifier, an amount of a first current from the circuit element varying with at least a third signal whose signal level is a function of signal levels of the first and second signals, the differential amplifier including a first transistor element and a second transistor element, which have input terminals for receiving the first and second signals, respectively; and
 a sub-circuit for generating a second current on a link connected to an output of the circuit to affect the output, the sub-circuit including a third transistor element and a fourth transistor element connected to each other, the third transistor element being connected to a terminal of the first transistor element other than the input terminal thereof, the fourth transistor element being connected to a terminal of the second transistor element other than the input terminal thereof, the second current being a version of the first current to reduce an effect of the third signal on the output.

7. The circuit of claim 6 comprising an operational amplifier (op amp) circuit.

8. The circuit of claim 6 wherein the circuit element includes a selected transistor.

9. The circuit of claim 8 wherein the selected transistor operates in a non-saturation mode.

10. The circuit of claim 8 wherein the selected transistor is an FET.

11. The circuit of claim 6 wherein the third signal includes a common-mode signal, the signal level of the third signal being a function of a sum of the signal levels of the first and second signals.

12. The circuit of claim 11 wherein the signal level of the third signal being an average of the signal levels of the first and second signals.

13. The circuit of claim 6 wherein the sub-circuit includes at least one current-mirror circuit.

14. An op amp circuit comprising:
 a differential amplifier including first transistor means and second transistor means, which have input terminals for receiving an inverting input signal and a non-inverting input signal, respectively;
 means for providing a first current to the differential amplifier, an amount of the first current varying with signal levels of the inverting and non-inverting input signals;
 means for obtaining a measure indicative of the amount of the first current, the obtaining means including third transistor means and fourth transistor means which are connected to each other, the third transistor means being connected to a terminal of the first transistor means other than the input terminal thereof, the fourth transistor means being connected to a terminal of the second transistor means other than the input terminal thereof; and
 means responsive to the measure for generating a second current on a link connected to an output of the circuit to affect the output.

15. The circuit of claim 14 wherein the output is a function of a difference between the signal levels of the inverting and non-inverting input signals.

16. The circuit of claim 14 wherein the amount of the first current is a function of a sum of the signal levels of the inverting and non-inverting input signals.

17. The circuit of claim 16 wherein the amount of the first current is a function of an average of the signal levels of the inverting and non-inverting input signals.

18. The circuit of claim 14 wherein the obtaining means includes a current-mirror circuit.

19. The circuit of claim 14 wherein the generating means includes a current-mirror circuit.

20. A method for use in an amplifier circuit, which includes a sub-circuit, and first, second, and third transistor elements, the second transistor element and the third transistor element being connected to the first transistor element, the second transistor element and the third transistor element having input terminals receiving inputs to the amplifier circuit, respectively, the sub-circuit including a fourth transistor element and a fifth transistor element connected to each other, the fourth transistor element being connected to a terminal of the second transistor element other than the input terminal thereof, the fifth transistor element being connected to a terminal of the third transistor element other than the input terminal thereof, the method comprising:
 operating the first transistor element in a non-saturation mode, an amount of a current from the first transistor element varying with the inputs;
 obtaining a measure indicative of the amount of the current from the first transistor element using the sub-circuit; and
 in response to the measure, providing a second current on a link connected to an output of the amplifier circuit to affect the output.

21. The method of claim 20 wherein an amount of the second current is a function of the amount of the current from the first transistor element.

22. A method for use in an amplifier circuit, which includes a differential amplifier, a sub-circuit and a circuit element which is connected to the differential amplifier, the differential amplifier including a first transistor element and a second transistor element, which have input terminals for receiving first and second signals input to the circuit, respectively, the sub-circuit including a third transistor element and a fourth transistor element connected to each other, the third transistor element being connected to a terminal of the first transistor element other than the input terminal thereof, the fourth transistor element being connected to a terminal of the second transistor element other than the input terminal thereof, the method comprising:
 receiving first and second signals using the input terminals, an amount of a first current from the circuit element varying with at least a third signal whose signal level is a function of signal levels of the first and second signals; and
 using the sub-circuit to generate a second current on a link connected to an output of the circuit to affect the output, the second current being a version of the first current to reduce an effect of the third signal on the output.

23. The method of claim 22 wherein the third signal includes a common-mode signal, the signal level of the third signal being a function of a sum of the signal levels of the first and second signals.

24. The method of claim 23 wherein the signal level of the third signal is an average of the signal levels of the first and second signals.

25. A method for use in an op amp circuit, which includes a differential amplifier and a sub-circuit, the differential amplifier comprising a first transistor element and a second transistor element which have input terminals, respectively, the sub-circuit comprising a third transistor element and a fourth transistor element connected to each other, the third transistor element being connected to a terminal of the first transistor element other than the input terminal thereof, the fourth transistor element being connected to a terminal of the second transistor element other than the input terminal thereof, the method comprising:

receiving an inverting input signal and a non-inverting input signal using the input terminals, respectively;

providing a first current to the differential amplifier, an amount of the first current varying with signal levels of the inverting and non-inverting input signals;

obtaining a measure indicative of the amount of the first current using the sub-circuit; and in response to the measure, generating a second current on a link connected to an output of the circuit to affect the output.

26. The method of claim 25 wherein the output is a function of a difference between the signal levels of the inverting and non-inverting input signals.

27. The method of claim 25 wherein the amount of the first current is a function of a sum of the signal levels of the inverting and non-inverting input signals.

28. The method of claim 27 wherein the amount of the first current is a function of an average of the signal levels of the inverting and non-inverting input signals.

* * * * *